United States Patent
Shouji et al.

(10) Patent No.: US 12,163,214 B2
(45) Date of Patent: Dec. 10, 2024

(54) COATED MOLD, METHOD FOR MANUFACTURING COATED MOLD, AND HARD COAT-FORMING TARGET

(71) Applicant: Proterial, Ltd., Tokyo (JP)

(72) Inventors: Tatsuya Shouji, Tokyo (JP); Fumiaki Honda, Tokyo (JP)

(73) Assignee: Proterial, Ltd., Tokyo (JP)

(*) Notice: Subject to any disclaimer, the term of this patent is extended or adjusted under 35 U.S.C. 154(b) by 450 days.

(21) Appl. No.: 17/438,930

(22) PCT Filed: Mar. 18, 2020

(86) PCT No.: PCT/JP2020/011956
§ 371 (c)(1),
(2) Date: Sep. 13, 2021

(87) PCT Pub. No.: WO2020/189717
PCT Pub. Date: Sep. 24, 2020

(65) Prior Publication Data
US 2022/0154323 A1 May 19, 2022

(30) Foreign Application Priority Data
Mar. 20, 2019 (JP) ................. 2019-052831

(51) Int. Cl.
*C23C 14/06* (2006.01)
*B21D 37/01* (2006.01)
(Continued)

(52) U.S. Cl.
CPC .......... *C23C 14/0641* (2013.01); *B21D 37/10* (2013.01); *C23C 14/021* (2013.01); *C23C 14/0664* (2013.01); *C23C 14/325* (2013.01)

(58) Field of Classification Search
CPC ...... B21D 37/01; B21D 37/10; C23C 14/0664
(Continued)

(56) References Cited

U.S. PATENT DOCUMENTS

2011/0016946 A1* 1/2011 Brahmandam ........ B21D 37/01
427/419.7

FOREIGN PATENT DOCUMENTS

CN 101121309 2/2008
CN 103826773 5/2014
(Continued)

OTHER PUBLICATIONS

Yamamoto, JP 2017206756A Google Patents Machine Translation printed on Dec. 13, 2023, Nov. 24, 2017, entire translation (Year: 2017).*
(Continued)

*Primary Examiner* — Mohammed S. Alawadi
(74) *Attorney, Agent, or Firm* — JCIPRNET

(57) ABSTRACT

A coated mold which can exhibit good sliding properties, and has further reduced droplets and excellent durability. The coated mold has a hard coating on a work surface, the hard coating including layer A in which layer a1 and layer a2 are alternately laminated, wherein the layer a1 is composed of a Cr-based nitride and has a thickness of 100 nm or less, and the layer a2 is composed of a nitride or carbonitride of $(V_{1-a}M_a)$ (M is at least one selected from Mo and W), has an atomic ratio a of M to the sum of V and M of 0.05 or more and 0.45 or less, and has a thickness of 80 nm or less. Also: a method for manufacturing a coated mold; and a hard coat-forming target which can be used in the method for manufacturing a coated mold.

5 Claims, 4 Drawing Sheets

(51) Int. Cl.
  *B21D 37/10* (2006.01)
  *B21K 5/20* (2006.01)
  *C23C 14/02* (2006.01)
  *C23C 14/32* (2006.01)
  *C23C 14/34* (2006.01)
  *C23C 28/00* (2006.01)
  *C23C 28/04* (2006.01)

(58) Field of Classification Search
  USPC .............................. 72/462, 476; 76/107, 101
  See application file for complete search history.

(56) References Cited

FOREIGN PATENT DOCUMENTS

| CN | 109127887 A | * | 1/2019 | ............. B21D 37/01 |
|---|---|---|---|---|
| JP | 2005177952 | | 7/2005 | |
| JP | 2011127205 | | 6/2011 | |
| JP | 2011183545 | | 9/2011 | |
| JP | 2015142944 | | 8/2015 | |
| JP | 2017206756 | | 11/2017 | |
| WO | 2013047548 | | 4/2013 | |
| WO | 2015079587 | | 6/2015 | |
| WO | 2016171273 | | 10/2016 | |
| WO | 2017199730 | | 11/2017 | |
| WO | WO-2017199730 A1 | * | 11/2017 | |

OTHER PUBLICATIONS

English translate (WO2017199730A1), retrieved date Apr. 17, 2024.*
English translate (CN109127887A), retrieved date Apr. 17, 2024.*
"Office Action of Korea Counterpart Application", issued on Jan. 8, 2024, with English translation thereof, p. 1-p. 6.
Office Action of China Counterpart Application, with English translation thereof, issued on Sep. 7, 2023, pp. 1-23.
"Office Action of Korea Counterpart Application", issued on Oct. 10, 2023, with English translation thereof, p. 1-p. 6.
"International Search Report (Form PCT/ISA/210) of PCT/JP2020/011956," mailed on Jun. 9, 2020, with English translation thereof, pp. 1-4.
"Office Action of Indonesia Counterpart Application", issued on Sep. 18, 2022, with English translation thereof, p. 1-p. 6.
"Written Opinion of the International Searching Authority (Form PCT/ISA/237) of PCT/JP2020/011956," mailed on Jun. 9, 2020, with English translation thereof, pp. 1-6.
Office Action of China Counterpart Application, with English translation thereof, issued on Jan. 5, 2023, pp. 1-19.
"Office Action of China Counterpart Application", issued on Mar. 28, 2024, with English translation thereof, pp. 1-21.
"Final Office Action of China Counterpart Application", issued on Jun. 5, 2024, with English translation thereof, pp. 1-24.

* cited by examiner (a)

(b)

COATED MOLD, METHOD FOR MANUFACTURING COATED MOLD, AND HARD COAT-FORMING TARGET

CROSS-REFERENCE TO RELATED APPLICATION

This application is a 371 application of the international PCT application serial no. PCT/JP2020/011956, filed on Mar. 18, 2020, which claims the priority benefit of Japan application no. 2019-052831, filed on Mar. 20, 2019. The entirety of each of the above-mentioned patent applications is hereby incorporated by reference herein and made a part of this specification.

TECHNICAL FIELD

The present invention relates to a coated mold coated with a hard coating, a manufacturing method for a coated mold, and a hard coat-forming target.

BACKGROUND ART

In the related art, molds made of steel, representative examples of which include cold dice steel, hot dice steel, and high-speed steel, super-hard alloys, and the like as base materials are used for plastic working such as forging and press working. In such plastic working using molds for press working or forging, wear such as abrasion and galling is likely to occur in work surfaces of the molds, and an improvement in mold lifetime is desired. Particularly, high molding pressures are applied to bending molds and drawing molds, and galling is likely to occur due to sliding between work materials and the molds. The galling described here is a phenomenon in which a chemically active surface is formed on one or both work surfaces of members that slide against each other, the chemically active surface strongly adheres and is fixed to its counterpart, and a constituent substance of one of the surfaces is caused to peel off and is then transferred to the counterpart surface. Therefore, molds used as bending molds or drawing molds are required to have particularly high levels of strength and galling resistance.

As a method for improving galling resistance of a mold, formation of a hard coating composed of a nitride or carbide through surface processing is effective. For the surface processing, a molten salt dipping method (hereinafter referred to as a TRD method), a chemical vapor deposition method (hereinafter referred to as a CVD method), a physical vapor deposition method (hereinafter referred to as a PVD method), or the like is used. Although in the TRD method or the CVD method, a mold made of steel as a main material is processed at a temperature close to a quenching temperature of the mold, is tempered, and is then used, deformation of the mold and a change in dimensions of the mold due to high-temperature processing may become problems in some cases. Also, although the processing is repeatedly used, the film is produced using carbon in the steel material of the mold base material in the TRD method or the CVD method, and carbon in the vicinity of the surface of the mold thus decreases after repeated processing, which may lead to degradation of hardness or degradation of adhesiveness to the film. On the other hand, a coating temperature in the PVD method is lower than the tempering temperature of steel from among various kinds of coat-forming means, the mold is less softened due to the coating, and deformation and a change in dimension of the mold are less likely to occur. As PVD coatings that improve abrasion resistance of molds, Ti-based coatings of TiN, TiCN, TiAlN, and the like, Cr-based coatings of CrN, CrAlN, AlCrN, and the like, V-based coatings of VCN, VC, and the like are implemented in the related art.

Various studies have been made for coating molds to which the aforementioned coatings are applied. For example, the applicant has proposed, in Patent Literature 1, a coated tool coated with a hard coating in which a nitride of AlCrSi and a nitride of V are alternately laminated for the purpose of improving sliding properties such as abrasion resistance and galling resistance in an environment of sliding with a material to be worked. Also, the applicant has proposed, in Patent Literature 2, a coated member with excellent sliding properties including a layer A in which a layer a1 including a coating metal part composed of a nitride or carbonitride of chromium with an atomic ratio of 30% or more and a layer a2 including a metal part composed of a nitride or carbonitride of vanadium with an atomic ratio of 60% or more are alternately laminated and a layer B on an upper layer of the layer A, wherein the layer B includes a metal part composed of a nitride or carbonitride of vanadium with an atomic ratio of 60% or more for the purpose of improving abrasion resistance and galling resistance of a mold.

CITATION LIST

Patent Literature

[Patent Literature 1]
Japanese Patent Laid-Open No. 2011-183545
[Patent Literature 2]
International Publication No. WO 2013/047548

SUMMARY OF INVENTION

Technical Problem

In recent years, mold coatings have been required to have further improved durability to address working in severe environments as in a case in which materials to be worked have higher strength and in a hot stamp method in which materials to be worked are heated and press molding and quenching are performed at the same time. On the other hand, droplets are inevitably formed in coatings and on coating surfaces in an arc ion plating method, in particular. Since the droplets may cause degradation of adhesive force of the coatings or damage, such as cracking, of the coatings, it is necessary to reduce the droplets in order to improve durability. Patent Literature 1 and 2 described above disclose excellent techniques of coated tools for excellent sliding properties achieved by a smooth coated structure including a nitride of V with excellent sliding properties in a hard coating and further including a reduced projecting portion on the coating surface which may serve as a start point for attacking a material to be worked. However, since only smoothing of the coating surface is described in regard to reduction of droplets, and there is no description or indication regarding reduction of droplets in the film, there is room for studies for further improving durability. In view of the aforementioned problem, the present invention provides a coated mold capable of exhibiting satisfactory sliding properties and achieving excellent durability through further reduction of droplets.

Solution to Problem

As a result of intensive studies, the present inventors have discovered elements and a coating configuration that enable reduction of droplets and thus achieved the present invention.

In other words, according to an aspect of the present invention, there is provided a coated mold which has a hard coating on a work surface, in which the hard coating includes a layer A in which a layer a1 and a layer a2 are alternately laminated, the layer a1 being composed of a Cr-based nitride and having a thickness of 100 nm or less, and the layer a2 being composed of a nitride or carbonitride of $(V_{1-a}M_a)$ (M is at least one selected from Mo and W), having an atomic ratio a of M to the sum of V and M of 0.05 or more and 0.45 or less, and having a thickness of 80 nm or less.

Preferably, the coated mold further includes a layer B that is formed on an upper layer of the layer A, is composed of a nitride or carbonitride of $(V_{1-a}M_a)$ (M is at least one selected from Mo and W), has an atomic ratio a of M to the sum of V and M of 0.05 or more and 0.45 or less, and has a thickness of 0.1 μm or more.

Preferably, a Young's modulus in the layer A of the hard coating is 250 Gpa or more, and nanoindentation hardness is 25 Gpa or more.

According to another aspect of the present invention, there is provided a method for manufacturing a coated mold that has a hard coating on a work surface, the method including: applying a layer A in which a layer a1 and a layer a2 are alternately laminated, the layer a1 being composed of a Cr-based nitride and having a thickness of 100 nm or less, and the layer a2 being applied using a hard coat-forming target composed of $(V_{1-a}M_a)$ (M is at least one selected from Mo and W) and having an atomic ratio a of M to the sum of V and M of 0.05 or more and 0.45 or less, being composed of a nitride or carbonitride of $(V_{1-a}M_a)$ (M is at least one selected from Mo and W), having an atomic ratio a of M to the sum of V and M of 0.05 or more and 0.45 or less, and having a thickness of 80 nm or less.

Preferably, the method further includes: applying, on an upper layer of the layer A, a layer B that is applied using a hard coat-forming target composed of $(V_{1-a}M_a)$ (M is at least one selected from Mo and W) and having an atomic ratio a of M to the sum of V and M of 0.05 or more and 0.45 or less, is composed of a nitride or carbonitride of $(V_{1-a}M_a)$ (M is at least one selected from Mo and W), has an atomic ratio a of M to the sum of V and M of 0.05 or more and 0.45 or less, and has a thickness of 0.1 μm or more.

According to another aspect of the present invention, there is provided a hard coat-forming target composed of $(V_{1-a}M_a)$ (M is at least one selected from Mo and W) and having an atomic ratio a of M to the sum of V and M of 0.05 or more and 0.45 or less.

Advantageous Effects of Invention

According to the present invention, it is possible to provide a coated mold with a hard coating which can exhibit good sliding properties and has further reduced droplets and excellent durability. Also, it is possible to provide a target suitable for forming the hard coating.

DESCRIPTION OF EMBODIMENTS

Figure 1:
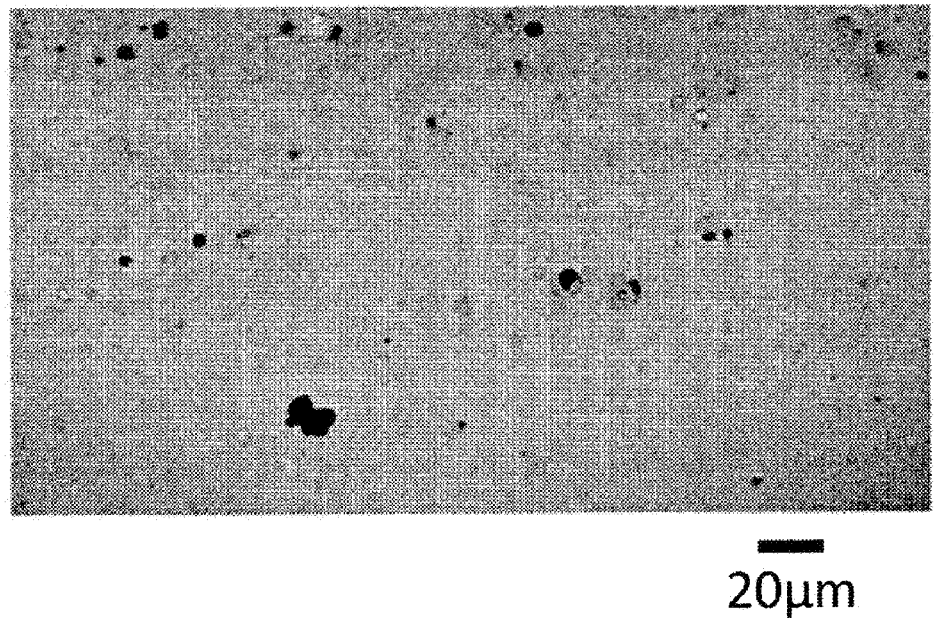
FIG. 1 is an image of a sample surface observed by an optical microscope in an example of the present invention.

Hereinafter, an embodiment of the present invention will be described in detail. Note that the present invention is not limited to the embodiment. A coated mold according to the present embodiment has a hard coating on a work surface. The hard coating includes an alternately laminated portion (layer A) in which a layer a1 composed of a Cr nitride and having a thickness of 100 nm or less and a layer a2 composed of a nitride or carbonitride of $(V_{1-a}M_a)$ (M is at least one selected from Mo and W), having an atomic ratio a of M to the sum of V and M of 0.05 or more and 0.45 or less, and having a thickness of 80 nm are alternately laminated.

The Cr-base nitride coating that is the layer a1 in the present embodiment (hereinafter, also referred to as a CrN-based coating) has excellent heat resistance and abrasion resistance and contributes to an improvement in mold lifetime in a high-load environment. The CrN-based coating is a coating containing 30% or more of Cr at an atomic ratio at a metal part containing a metalloid. If the content of Cr is 30% or more, at least one kind or two or more kinds of group 4 transition metals, group 5 transition metals, group 6 transition metals, Al, Si, and B may be contained within a scope in which effects of the layer a1 are not inhibited. It is a matter of course that the content of Cr may be 100%. For example, it is preferable to select one from CrN, CrTiN, CrVN, CrSiN, CrBN, CrSiBN, CrTiSiN, CrVSiN, AlCrN, AlTiCrN, AlVCrN, AlCrSiN, AlTiCrSiN, and AlVCrN for the CrN-based coating so that it is possible to improve abrasion resistance in a high-temperature region. Note that in a case in which the layer a1 includes V, the content of V included in the CrN-based coating is preferably less than 50%. More preferably, AlCrSiN is applied. In a case in which the content of Cr is less than 30%, the aforementioned effect of improving heat resistance and abrasion resistance tends to be harder to obtain. An upper limit of the Cr content is not particularly limited and may be appropriately changed in accordance with a type and an application of the coating. In a case in which AlCrSiN is applied, for example, the content of Cr may be set to 80% or less in terms of an atomic ratio in order for the effect of improving heat resistance and abrasion resistance to be more easily obtained. In a case in which AlCrSiN is applied, it is preferable to perform control such that $20 \leq x < 70$, $30 \leq y < 75$, and $0 < z < 10$ are achieved in a composition formula of $Al_xCr_ySi_z$ so that it is possible to curb formation of a fragile hexagonal structure as a main structure, to obtain a cubic structure as a main structure, and to stably improve abrasion resistance and heat resistance. The aforementioned crystal structure can be checked by an X-ray diffraction method, and if a peak of a cubic structure corresponds to a maximum strength, it is possible to consider the cubic structure as a main structure even if other crystal structures are included.

One important feature of the layer a2 in the present embodiment is that it is composed of a nitride or carbonitride of $(V_{1-a}M_a)$ (M is at least one selected from Mo and W). The VMN-based coating is appropriately oxidized at the time of working, forms an oxidation layer, and forms a complex oxide with a low melting point including a constituent of the material to be worked. Therefore, it is possible to prevent adhesion of the material to be worked and to curb local galling and adhesive abrasion in an initial stage of the working. On the other hand, since V has lower thermal conductivity than other metal elements used for the hard coating, and a micro molten pool is likely to be largely and deeply formed through arc discharge to a V target at the time of arc ion plating using the target of V alone, a trend of a larger number of droplets being generated and the sizes of the droplets being likely to become larger is observed. Thus, the present embodiment enables improvement of durability of the coating through curbing of the droplets without damaging excellent sliding properties by employing the VMN-based coating as described above. Here, at least one of Mo or W is selected for M in the present embodiment. This is because Mo and W are completely dissolved in V and do not form any intermetallic compound, and therefore enable discharge to be stabilized at the time of film formation based on the PVD and a fine coating to be stably applied with fewer defects. Also, since Mo and W have higher melting points and thermal conductivity than V, it tends to become easier to reduce the area of the molten pool generated on the target surface, which will be described later, and it is possible to curb generation of droplets. Moreover, it is possible to increase a Young's modulus and hardness by employing the VMN-based coating containing Mo or W. The increase in Young's modulus and hardness of the hard coating leads to an improvement of fracture resistance against external force and contributes, along with the effect of curbing droplets, to improvement in durability of the coating. In other words, it is preferable that the Young's modulus of the hard coating in the layer A be 250 GPa or more and nanoindentation hardness be GPa or more so that it is possible to more easily obtain the aforementioned effect of improving durability. The Young's modulus is more preferably 300 GPa or more, and nanoindentation hardness is more preferably 30 GPa or more.

In the present embodiment, an atomic ratio a of M is assumed to be 0.05 or more and 0.45 or less. An atomic ratio of M of more than 0.45 is not preferable because it makes degradation of a film formation rate more likely to occur. There is also a probability of the effect of curbing adhesive abrasion being unable to be sufficiently exhibited because the amount of V in the alloy decreases. In a case in which the atomic ratio of M is less than 0.05, the effect of V becomes the main effect, and the effect of curbing droplets cannot be obtained. Note that at least one kind or two or more kinds of group 4 transition metals, group 5 transition metals, group 6 transition metals, Al, Si, and B may be included in addition to V, Mo, and W within a scope in which the effects of the present invention are not inhibited. A preferable upper limit of the atomic ratio a of M is 0.40, and a preferable lower limit a of the atomic ratio of M is 0.1. A more preferable upper limit of the atomic ratio a of M is 0.35, and a more preferable lower limit of the atomic ratio a of M is 0.15.

In a case in which the sum of metal elements and non-metal elements in the entire coating is assumed to be 100%, the atomic ratio of the nitrogen elements in the coating is preferably 45% or more and 55% or less in the layer a1 and the layer a2 in the present embodiment. It is possible to further improve heat resistance of the coating by controlling nitrogen within the aforementioned range.

The hard coating in the present embodiment has a structure in which the aforementioned layer a1 and layer a2 are alternately laminated. With this structure, it is possible to effectively exhibit the abrasion resistance and heat resistance that the CrN-based coating has and galling resistance and adhesive resistance that the VMN-based coating has without the effects mutually inhibiting one another. The film thickness of each layer a1 is preferably 100 nm or less, and the film thickness of each layer a2 is preferably 80 nm so that it is possible to exhibit the aforementioned properties with a satisfactory balance. The thickness of each layer a1 and each layer a2 is more preferably 30 nm or less. The thickness is more preferably 20 nm or less and is further preferably 15 nm or less. The thickness can be adjusted through control of an input power to be applied to the target, a chamber volume and a table rotation frequency of the apparatus used for the film formation, and the like. Moreover, the film thickness of the layer a1 and the layer a2 is preferably set to 2 nm or more in order to more reliably obtain the effect of improving abrasion resistance.

As described above, the layer a1 and the layer a2 may be laminated to a specific film thickness or may be laminated while the thickness is caused to vary as long as the film thickness of the layer a1 is within a range of 100 nm or less and the film thickness of the layer a2 is within a range of 80 nm or less. In the case in which the layer a1 and the layer a2 are laminated to a specific thickness, for example, it is only necessary to cause the layer a2 to be thicker than the layer a1 when priority is placed on sliding properties, or it is only necessary to cause the layer a1 to be thicker than the layer a2 when priority is placed on abrasion resistance. Also, in the case in which the thickness is caused to vary, it is possible to exhibit the effects when the thickness varies in an inclined manner or a stepwise manner, and the thickness may be appropriately selected in accordance with a purpose. Easy production can be achieved even with a general PVD apparatus in a case in which the thickness is caused to change in a stepwise manner, or stress distribution inside the coating is stabilized, and peeling between layers is unlikely to occur if the thickness is caused to change in an inclined manner, for example. Here, "change in an inclined manner" means that at least one of the layer a1 or the layer a2 varies. "Change in a stepwise manner" means that two or more layers with the same thickness are included in the layers 1a and a2.

For example, in a case in which it is desired to improve abrasion resistance in and after an intermediate stage of working while improving sliding properties of the coated tool in the initial stage of the working, the thickness of the layer a2 may be caused to increase toward the outer surface side, or the thickness of the layer a1 may be caused to decrease toward the outer surface side.

In the present embodiment, it is preferable to form the CrN-based coating immediately below the aforementioned alternately laminated portion (layer A) in order to further enhance the abrasion resistance in and after the intermediate stage of the working. This is because although adhesion is likely to occur if damage advances and reaches the CrN-based coating and there is a concern that a sufficient effect of adhesion resistance cannot be exhibited as described above, it is possible to detect damage of coating and to curb the damage reaching the base material by intentionally causing adhesion on the base material side. Note that although the CrN-based coating is preferably a Cr-based nitride including the same component as that of the layer a1 described above so that it is industrially practical, the CrN-based coating may be a layer including a component that is different from that of the layer a1. The CrN-based coating can have a single layer or a multilayer structure (including an alternately laminated structure) in accordance with desired properties. Particularly, the CrN-based coating preferably has an alternately laminated structure so that, when cracking goes through a lamination interface at the time of fracture of the film, a developing route of the cracking becomes complicated, sudden development is curbed, and as a result, it is possible to improve fracture resistance of the film. Here, in a case in which an alternately laminated structure of a layer b1 and a layer b2 is selected for the CrN-based coating immediately below the alternately laminated portion, the layer b1 and the layer b2 can be selected from CrN, CrTiN, CrVN, CrSiN, CrBN, CrSiBN, CrTiSiN, CrVSiN, AlCrN, AlTiCrN, AlVCrN, AlCrSiN, AlTiCrSiN, and AlVCrSiN.

The total thickness of the CrN-based coating formed immediately below the alternately laminated portion is preferably 0.5 μm or more and is preferably 50 μm or less. A more preferable thickness of the CrN-based coating is 40 μm or less, and a further preferable thickness of the CrN-based coating can be set to 30 μm or less, 20 μm or less, or 10 μm or less. Also, in a case in which an alternately laminated structure of the layer b1 and the layer b2 is selected, the film thickness of each of the layer b1 and the layer b2 is preferably 0.002 μm to 0.1 μm. In addition, the CrN-based coating formed immediately below the alternately laminated portion is preferably formed to be 1.2 times or more as thick as the layer a1.

In the present embodiment, it is preferable to form a layer B composed of a nitride or carbonitride of $(V_{1-a}M_a)$ (M is at least one kind selected from Mo and W), having an atomic ratio a of M to the sum of V and M of 0.05 or more and 0.45 or less, and having a thickness of 0.1 μm on an upper layer of the alternately laminated portion (layer A) in order to further improve affinity between the mold and the material to be worked in the initial stage of the working and to curb unexpected galling. Although the layer B is also preferably a VMN-based coating layer of the same component as that of the layer a2 so that it is industrially practical, the layer B is not limited thereto and may be a layer including a component that is different from that of the layer a2. The thickness of the layer B is preferably 0.1 μm or more and is more preferably 0.2 μm or more. Although an upper limit of the thickness is not particularly limited, the film thickness is preferably 8 μm or less because it takes a long time to form the film and producibility is degraded if the film thickness is excessively thick. Also, because abrasion resistance of the entire coating may be degraded depending on an environment of utilization, a more preferable film thickness is 5 μm or less, and a further preferable film thickness is 3 μm or less. Note that the layer B is preferably formed to be 1.2 times or more as thick as the layer a2.

The total thickness of the alternately laminated portion (layer A) in the present embodiment is preferably 1 μm to 50 μm. The total thickness is more preferably 2 μm to 30 μm. This is because the aforementioned abrasion resistance or adhesion resistance cannot sufficiently be improved, and the coating tends to be damaged early if the total thickness is excessively thin, and a dimensional tolerance of the mold is exceeded, a clearance in the molded surface becomes insufficient, and there is a probability of a molding load increasing due to excessive drawing working if the total thickness is excessively thick.

Next, a hard coat-forming target according to the present invention will be described.

In order to apply the VMN-based coating used for the layer a2 and the layer B of the hard coating according to the present embodiment, the target according to the present embodiment is a hard coat-forming target composed of $(V_{1-a}M_a)$ (M is at least one selected from Mo and W) and having an atomic ratio a of M to the sum of V and M of 0.05 or more and 0.45 or less to obtain substantially the same composition as that of the hard coating according to the present invention.

Since at least one kind of Mo and W is selected as an M element for the target according to the present embodiment, there is a trend that the area of the molten pool formed on the target surface shrinks as compared with the target of V alone, which contributes to curbing of droplets. In other words, a decrease of the molten pool in size leads to a decrease in droplets generated from the molten pool, and the number of droplets also decreases. The effect of curbing droplets that appears by Mo or W with a higher melting point and higher thermal conductivity than those of V contained in the target is considered to depend on concentration distribution of added elements in the target. In other words, in a case in which the target is manufactured by a powder metallurgy method, an area of only V is separated by added elements, and the aforementioned effects are exhibited by causing the added elements to be distributed in the target in a scale equivalent to or less than the molten pool (about 10 to 200 μm in the present invention) generated through arc discharge. To do so, it is preferable to set the particle diameter of the added element powder to be smaller than the particle diameter of V powder that is a main component in order to enhance dispersibility of the added elements in addition to the setting of the particle diameter of the V powder to be equivalent or less than the scale of the molten pool. Note that in a case in which metal is dissolved to manufacture the V alloy target, it is preferable to sufficiently diffuse the added elements. Also, in a case in which concentration distribution of the added elements occurs, it is preferable to reduce the scale of the area of only V to be equivalent to or less than the scale of the molten pool (about 10 to 200 μm) that is formed on the surface of the target of V alone. Specifically, it is possible to measure the concentration distribution through line analysis or element mapping using an electron probe microanalyzer (EPMA) and perform evaluation through comparison with the molten pool.

Note that the other contained elements and impurity elements may be included with a minute amount (0.1% to 1%) within a range in which the properties of the coating in the present invention are not impaired. Examples of the impurity elements include Fe, C, O, and N.

The $(V_{1-a}M_a)$ alloy target according to the present embodiment has an atomic ratio a of M to the sum of V and M of 0.05 or more and 0.45 or less. It is possible to reduce a difference between the coating composition and the target composition and to stably form the coating with desired properties by causing the atomic ratio to fall within the range. In a case in which the atomic ratio a of M is more than 0.45, there is a trend that the film formation rate decreases and this leads to decrease in producibility. In a case in which the atomic ratio a of M is less than 0.05, a coating including V as a main material is formed, and it is thus not possible to obtain the effect of curbing droplets. A preferable lower limit of the atomic ratio a is 0.1, and a preferable upper limit of the atomic ratio a is 0.40. Although it is possible to apply the $(V_{1-a}M_a)$ alloy target according to the present embodiment to an existing film formation method, it is preferable to use the $(V_{1-a}M_a)$ alloy target for a physical vapor deposition method (PVD) such as an arc ion plating method or a sputtering method by which it is possible to perform the application processing at a lower temperature than the tempering temperature of the mold and to curb a variation in dimension of the mold. Particularly, it is preferable to use the $(V_{1-a}M_a)$ alloy target for the arc ion plating in which droplets are likely to be formed while excellent adhesiveness and a throwing power to a sample are achieved. Note that although the $(V_{1-a}M_a)$ alloy target according to the present embodiment is preferably used in the layer a2 and the layer B of the hard coating according to the present embodiment, the $(V_{1-a}M_a)$ alloy target may be applied to other applications of applying the VMN-based coating to another VMN-based single-layer film or a multilayer coating other than that in the present embodiment.

A method for manufacturing the coated mold according to the present invention is a method for manufacturing a coated mold that has a hard coating on a work surface, the method including a process of applying the layer A in which the layer a1 composed of a Cr-based nitride and having a thickness of 100 nm or less and the layer a2 composed of a nitride or carbonitride of $(V_{1-a}M_a)$ (M is at least one selected from Mo and W), having the atomic ratio a of M to the sum of V and M of 0.05 or more and 0.45 or less, and having a thickness of 80 nm or less are alternately laminated; and a process of applying the layer B having a thickness of 0.1 μm or more on the upper layer of the layer A using the hard coat-forming target composed of $(V_{1-a}M_a)$ (M is at least one selected from Mo and W) and having the atomic ratio a of M to the sum of V and M of 0.05 or more and 0.45 or less. For the method for forming the hard coating, it is preferable to select a physical vapor deposition (PVD) method such as an arc ion plating method or a sputtering method by which it is possible to perform the application processing at a lower temperature than the tempering temperature of the mold and to curb a variation in dimension of the mold. More preferably, the arc ion plating method in which droplets are likely to be formed is applied. In order to obtain a hard coating that is smoother and has more excellent sliding properties, the surface of the hard coating may be polished during or after the application.

Although the materials (the main material and the base material) used for the mold according to the present invention are not particularly defined, it is possible to appropriately use tool steel such as cold dice steel, hot dice steel, and high-speed steel, super-hard alloy, and the like. A mold to which surface hardening processing using diffusion, such as nitriding processing or carburizing processing, is applied in advance may be used. Also, a coating that is different from the hard coating may be formed on the surface of the mold within a range in which aforementioned effects of the hard coating according to the present invention are not inhibited.

EXAMPLES

Example 1

First, target materials in examples of the present invention and comparative examples were produced. V powder with purities of 99.9% or more and Cr, Fe, Nb, Mo, and W powder were prepared, were scaled such that the composition formulae satisfied the atomic ratios shown in Table 1, and were mixed with a V-type mixer, thereby producing mixed powder. Next, capsules made of soft steel were filled with the thus obtained mixed powder, were degassed and sealed, and were then sintered under conditions at a temperature of 1250° C., at a pressure of 120 MPa, and for a duration of 10 hours using a hot isostatic press, thereby producing sintered bodies. Note that as the V powder, crushed powder with particle diameters of 150 μm or less and with D50 of 87 μm was used. Also, as the Cr, Fe, and Nb powder, crushed powder with particle diameters of 150 μm or less was used. The Mo powder obtained by a hydrogen reduction method of molybdenum trioxide powder to have particle diameters (Fisher diameter) of 0.6 to 1.0 μm was used. The W powder was obtained by a chemical extraction method, and W powder with particle diameters (Fisher diameters) of 0.6 to 1.0 μm was used. Machine working was then performed on the thus obtained sintered bodies, thereby producing $(V_{1-a}M_a)$ alloy targets with a diameter of 105 mm×a thickness of 16 mm. Compositions of the produced targets are shown in Table 1. Table 1 shows thermal conductivity and melting points (thermal conductivity and a melting point of V for the 100 V target) of the added element M extracted from Reference Literature (Metal Data Book, 4th edition, the Japan Institute of Metals and Materials, Maruzen, 2004) together.

As base materials that were target of application, base materials on which mirror polishing of SKH51 (21 mm×17 mm×2 mm) and degrease cleaning were done were prepared, and the prepared base materials were placed inside an arc ion plating apparatus with a structure in which the base materials rotate at the center surrounded by a plurality of targets. AlCrSi targets ($Al_{60}Cr_{37}Si_3$ (at %)) targets were used as the targets for the layer a1, and produced $(V_{1-a}M_a)$ alloy targets were used as the targets for the layer a2. Thereafter, the base materials were heated and degasified at 450° C. inside the apparatus, Ar gas was then introduced, and plasma cleaning processing (Ar ion etching) was performed on the surfaces of the base materials in an initial process. Subsequently, application was performed on the base materials after the plasma cleaning processing, thereby producing Sample Nos. 1 to 6. As a configuration for each coating, 17 to 20 μm of coating (layer A: alternately laminated portion) composed of an alternately laminated structure (hereinafter, also referred to as AlCrSiN/$(V_{1-a}M_a)$N) of AlCrSiN and $(V_{1-a}M_a)$N was laminated on a formed AlCrSiN layer with a thickness of 1 μm, and 0.5 μm of $(V_{1-a}M_a)$N film (layer B) was formed on a topmost layer. Note that Sample No. 6 included 100% of V (a=0%). Note that in Sample Nos. 1 to 6, the thickness of the layer a1 was about 9 nm and the thickness of the layer a2 was about 12 nm.

Figure 2:
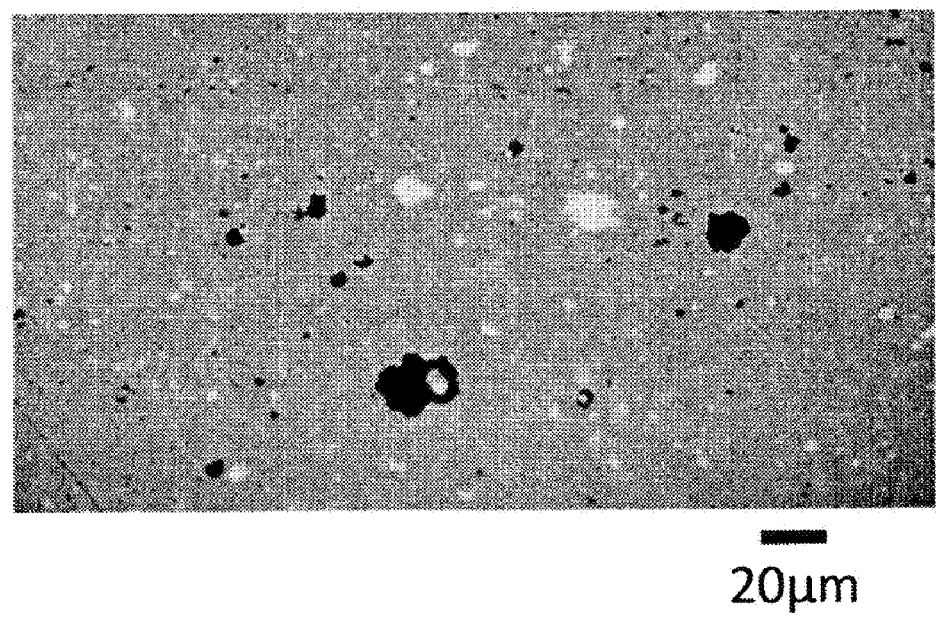
FIG. 2 is an image of a sample surface observed by an optical microscope in a comparative example.

Next, coating sections of the produced samples obtained by inclining the test pieces by 5 degrees with respect to the outermost surfaces of the hard coatings were adjusted through mirror polishing, and observation surfaces corresponding to the alternately laminated portions (layer A) in the sections were observed using an optical microscope. A photograph of Sample No. 2 in an example of the present embodiment is shown in FIG. 1, and a photograph of Sample No. 6 in a comparative example is shown in FIG. 2. In the optical microscope photographs in the drawings, white dots correspond to droplets. In the layers A produced using the targets of Nos. 1 and 2 (M: Mo, W) in the examples of the present invention, droplets were significantly reduced as compared with those using the targets of Nos. 3 to 5 (M: Cr, Fe, Nb) and No. 6 of V 100% (a=0%) in the comparative examples, which showed that it was possible to reduce the droplets with added elements with high thermal conductivity and high melting points.

TABLE 1

| Sample No. | Target atomic ratio | Thermal conductivity of added element M (W/Mk) | Melting point of added element M (K) | Amount of droplets | Remarks |
|---|---|---|---|---|---|
| No. 1 | 80V-20Mo | 137 | 2903 | Small | Example of the invention |
| No. 2 | 80V-20W | 174 | 3653 | Small | Example of the invention |
| No. 3 | 80V-20Cr | 91.3 | 2163 | Large | Comparative example |
| No. 4 | 80V-20Fe | 78.2 | 1809 | Large | Comparative example |
| No. 5 | 80V-20Nb | 54.1 | 2793 | Large | Comparative example |
| No. 6 | 100V | 31.6 | 2108 | Large | Comparative example |

Example 2

Next, the amounts of added elements M (W, Mo) from which the effect of reducing droplets was observed in Example 1 were examined. Target materials in the examples of the present invention were produced in the same way as that in Example 1 such that the composition formula of the atomic ratio satisfied $V_{1-a}M_a$. Compositions of the produced targets are shown in Table 2. The same application process as that in Example 1 was performed other than that the materials of the coatings in regard to the application process as well, thereby producing Sample Nos. 7 to 13.

Here, the same sample as Sample No. 1 in Example 1, the same sample as Sample No. 2 in Example 1, and the same sample as Sample No. 6 in Example 1 were used as Sample No. 8, Sample No. 11, and Sample No. 13, respectively.

Next, coating sections of the produced samples obtained by inclining the test pieces by degrees with respect to the outermost surfaces of the hard coatings were adjusted through mirror polishing, and hardness measurement and quantitative analysis of the coating components were performed on observation surfaces corresponding to the alternately laminated portions (layer A) in the coating sections. A nanoindentation apparatus manufactured by Bruker AXS was used to measure hardness (nanoindentation hardness) and Young's modulus of the observation surfaces. For the measurement of the hardness and elastic modulus, the hardness and the elastic modulus were obtained from average values at ten points measured under an indentation load of 5000 μN. For the quantitative analysis of the coating components, an electron probe microanalyzer (EPMA; JXA-8900R manufactured by JEOL Ltd.) was used for the analysis. As analysis values, average values of spot measurement performed at five locations with an acceleration voltage of 15 kV were employed. The amounts of Mo and W in (V, M) were obtained from the measurement values of Al, Cr, Si, C, Mo, W, and N and were defined as the metal component compositions for the layers a2. The results are shown in Table 2. Note that although not shown in the table, it has already been confirmed that the metal component ratios of the layers B were in the same levels as those of the metal component ratios of the layers a2. Although not shown in the table, 50V-50Mo and 50V-50W were also examined in comparative examples. As a result, arc discharge was not stabilized and it was difficult to form coatings with a desired thickness from both the targets as compared with the other examples, and the experiment was thus stopped.

TABLE 2

| Sample No. | Target atomic ratio | Layer a2 metal component ratio | Layer A thickness (μm) | Layer A hardness (GPa) | Layer A Young's modulus (GPa) | Remarks |
|---|---|---|---|---|---|---|
| No. 7 | 90V—10Mo | 93V—7Mo | 19.4 | 27.2 | 309 | Example of the invention |
| No. 8 | 80V—20Mo | 84V—16Mo | 20.0 | 30.8 | 328 | Example of the invention |
| No. 9 | 65V—35Mo | 67V—33Mo | 16.9 | 31.8 | 349 | Example of the invention |
| No. 10 | 90V—10W | 93V—7W | 16.8 | 30.4 | 323 | Example of the invention |
| No. 11 | 80V—20W | 83V—17W | 16.2 | 33.1 | 336 | Example of the invention |
| No. 12 | 65V—35W | 68V—32W | 17.1 | 33.5 | 349 | Example of the invention |
| No. 13 | 100V | 100V | 20.8 | 22.3 | 270 | Comparative Example |

As a result of the quantitative analysis, 70% or more of the amounts of Mo and Wo contained in the targets in the metal component compositions of the layers a2 were taken into the coating layers, the proportions of the amounts of Mo and W included in the layer a2 increased as more Mo and W were included in the targets, and it was thus possible to recognize that the layers a2 were able to be efficiently alloyed in the present embodiment. As a result of a hardness test, both the hardness and Young's modulus of the coatings that include large amounts of Mo and Wo in the layers a2 increased. Since the hardness and the Young's modulus had positive correlations with abrasion resistance and rigidity, respectively, the results showed that the present invention had effects of abrasion resistance and durability of the coatings.

Figure 3:
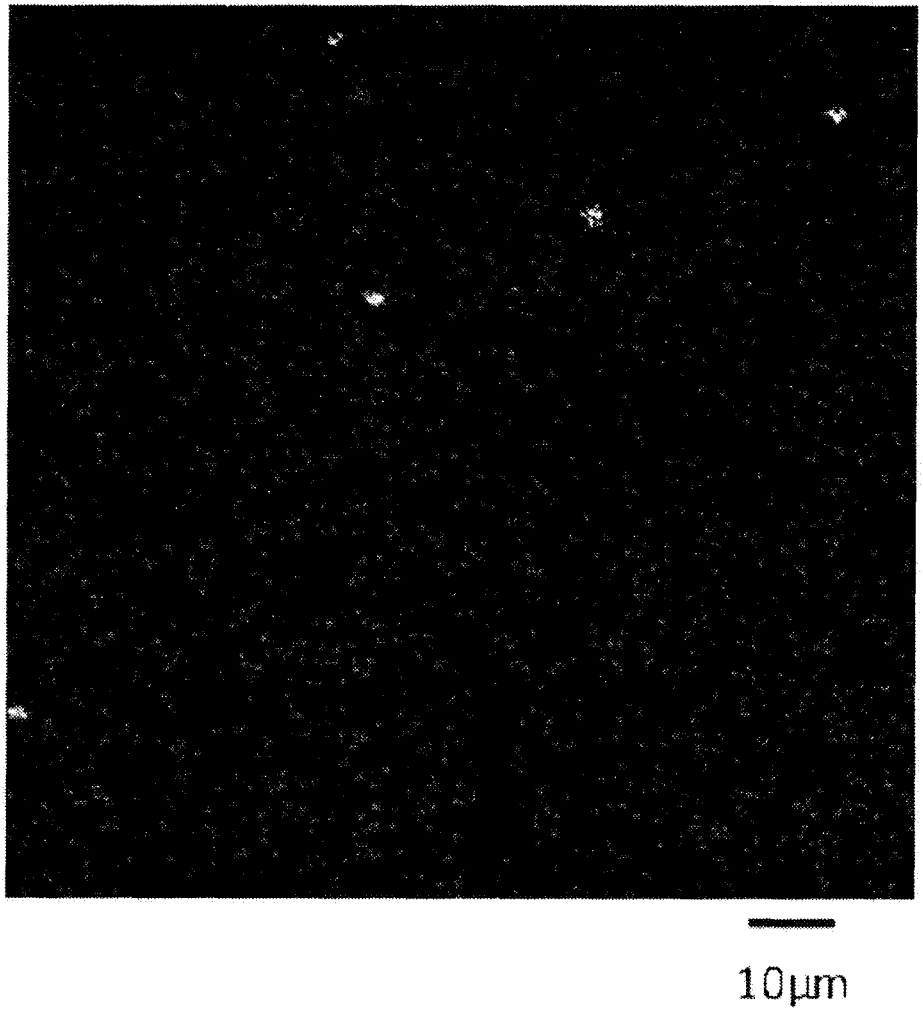
FIG. 3 is an image of a sample surface observed by an EPMA in the example of the present invention.
Figure 4:
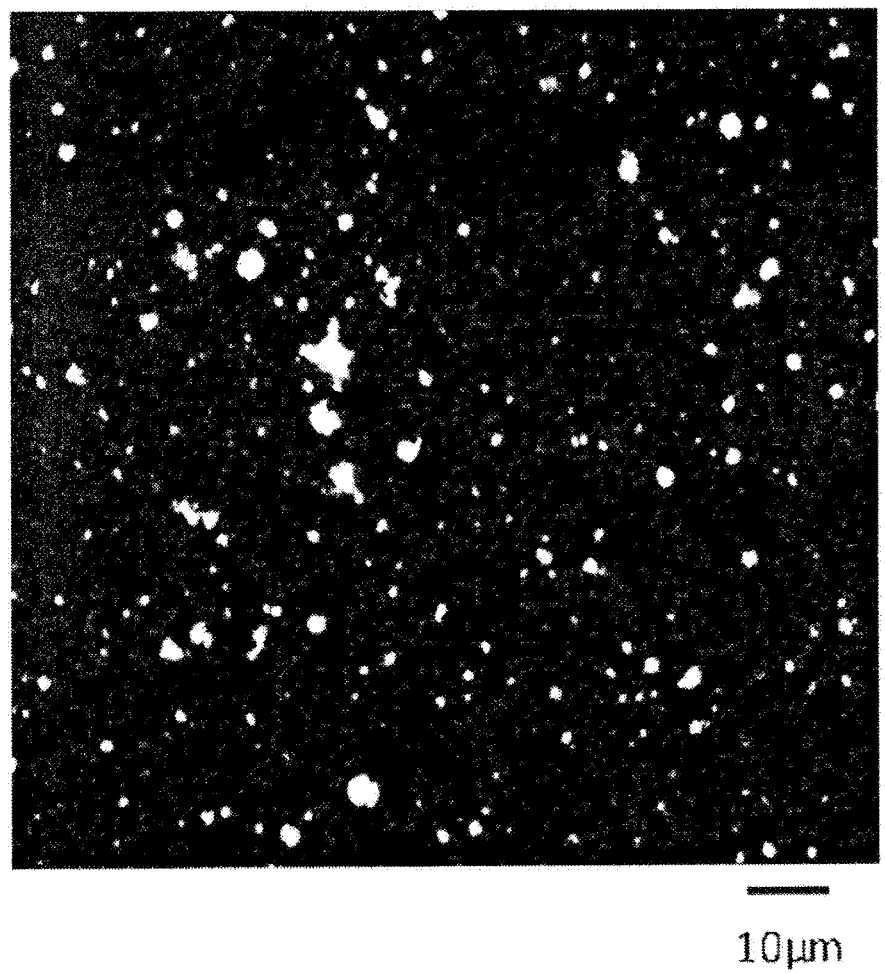
FIG. 4 is an image of a sample surface observed by an EPMA in the comparative example.

Next, quantitative evaluation of droplets included in the coatings was carried out. Five regions, each had a longitudinal size of 100 μm and a lateral size of 100 μm, were extracted from each of the coating sections corresponding to the alternately laminated portions similar to those at the locations of the observation in the examples. Then, element mapping analysis was conducted on the individual regions using EPMA, thereby obtaining the number and areas of V, Mo, and W droplets with equivalent circle diameters of 0.1 μm or more. For image processing and analysis, open-source software ImageJ was used. FIGS. 1 and 2 show element mapping images of V in the regions and images (field-of-view area of 100 μm×100 μm) obtained by binarizing the element mapping images of Sample Nos. 2 and 13, respectively. Note that in FIGS. 3 and 4, white dots correspond to the droplets.

Next, the numerical values of the numbers and the areas of the droplets obtained in the individual regions were aggregated in the five regions, thereby obtaining the number and the area rate of the droplets in each of Sample Nos. 7 to 13. Note that the number of the droplets of V is shown as the number of droplets in Sample No. 13, and the total number of the droplets of V and the droplets of M (Mo or W) are indicated for Sample Nos. 7 to 12 using the $(V_{1-a}M_a)$ alloy targets. Measurement results are shown in Table 3. As shown in Table 3 and FIGS. 3 and 4, it was possible to confirm that the area rates and the numbers of the droplets in the alternately laminated portions significantly decreases in the VMN-based coatings and more significant effect of M was obtained as the content of M with respect to V increased.

TABLE 3

| Sample No. | Target atomic ratio | Droplet area rate (%) | Number of droplets | Remarks |
|---|---|---|---|---|
| No. 7 | 90V-10Mo | 0.27 | 940 | Example of the invention |
| No. 8 | 80V-20Mo | 0.09 | 419 | Example of the invention |
| No. 9 | 65V-35Mo | 0.06 | 227 | Example of the invention |
| No. 10 | 90V-10W | 0.63 | 418 | Example of the invention |
| No. 11 | 80V-20W | 0.44 | 368 | Example of the invention |
| No. 12 | 65V-35W | 0.19 | 101 | Example of the invention |
| No. 13 | 100V | 1.05 | 1225 | Comparative Example |

Example 3

Next, a test of comparing sliding properties of the samples in the examples of the present invention and the comparative example was carried out. As base materials to be coated, base materials of pre-hardened steel (15 mm×10 mm×10 mm) adjusted to 60HRC on which mirror polishing and degrease cleaning were done were prepared and were placed in an arc ion plating apparatus with a structure in which the base materials rotated at the center surrounded by a plurality of targets. AlCrSi targets ($Al_{60}Cr_{37}Si_3$ (at %)) were used as targets for the layer a1, and (V80W20 (at %)) alloy targets or V targets were used as the targets for the layer a2. Thereafter, the base materials were heated and degasified at 450° C. in the apparatus, Ar gas was then introduced, and plasma cleaning processing (Ar ion etching) was performed on the surfaces of the base materials in an initial process. Next, Sample Nos. 14 to 20 applied to base materials after the plasma cleaning processing were produced. Sample No. 14 was manufactured by laminating 9.3 μm of coating (layer A: alternately laminated portion) composed of an alternately laminated structure of AlCrSiN (layer a1) and VWN (layer a2) on 3.0 μm of AlCrSiN layer formed on the base material. For Sample Nos. 15 and 16, 4.4 μm of CrN layers were formed on the base materials, then 2.8 μm of coatings composed of alternately laminated structures of AlCrSiN and CrN were applied immediately above the CrN layers, and 2.4 μm of coatings (layer A: alternately laminated portion) composed of alternately laminated structures of AlCrSiN (layer a1) and VWN (layer a2) was applied thereon. For Sample Nos. 17 to 20, 13 μm of coatings composed of alternately laminated structures of AlCrSiN (corresponding to the layer a1) and VN (corresponding to the layer a2) were applied. In Sample Nos. 14 to 20, the thickness of the layer a1 was about 9 nm, and the thickness of the layer a2 was about 12 nm.

Figure 5:
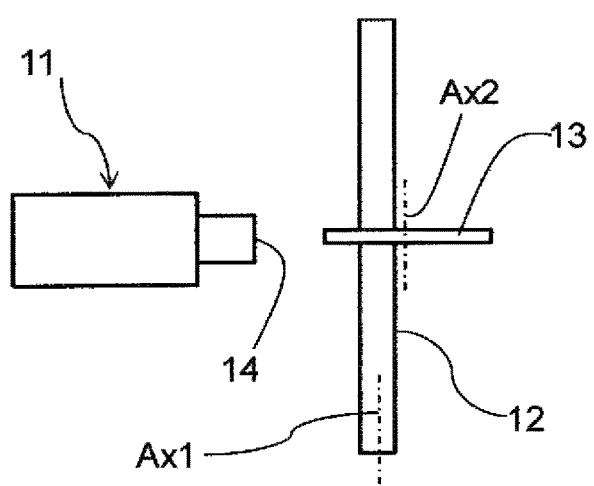
FIG. 5 is a schematic top view of a sliding test apparatus used in the example.
Figure 6:
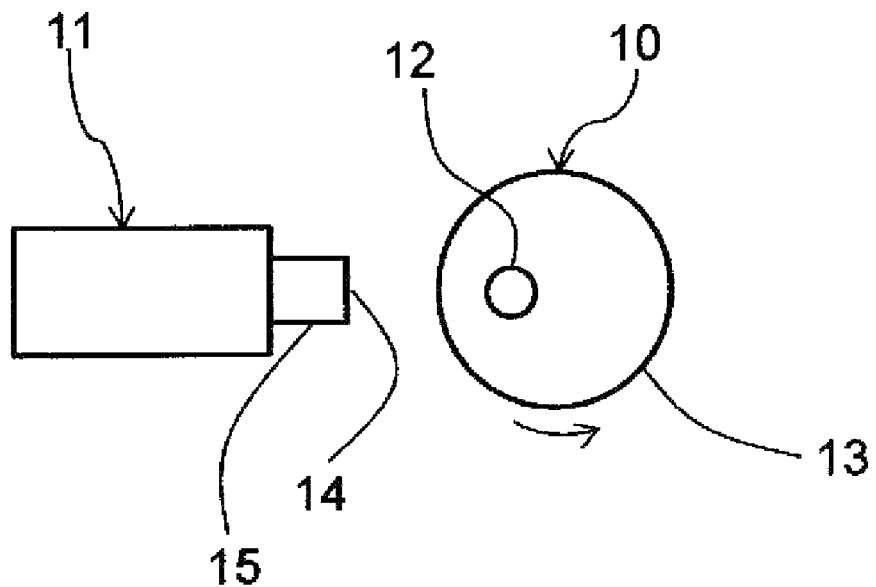
FIG. 6 is a schematic side view of a sliding test apparatus used in the example. (a) of FIG. 6 is a schematic side view illustrating a circular plate-shaped portion when it is separated from the sample, and (b) of FIG. 6 is a schematic side view illustrating a circular plate-shaped portion when it is in contact with the sample.
Figure 6:
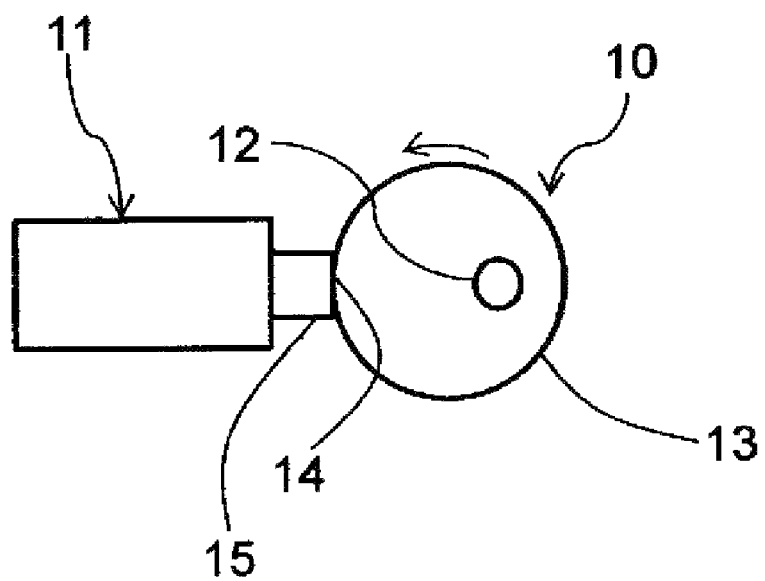

Schematic views of the apparatus used in the sliding test are shown in FIG. 5, (a) of FIG. 6 and (b) of FIG. 6. FIG. 5 is a top view of the test apparatus, and (a) of FIG. 6 and (b) of FIG. 6 are side views of FIG. 5. As illustrated in the drawings, the test apparatus used in the present embodiment includes a holding mechanism 11 including an arm portion 15 for holding a sample with the sample attached to a sample placement portion 14, a contact jig 10 that repeats contact and non-contact with the sample while rotating, and a rotation mechanism (not illustrated) that rotatably holds the contact jig 10. The contact jig 10 is configured with a shaft portion 12 with a rotation axis A×1 and a circular plate-shaped portion 13 with a center axis A×2 that is eccentric from the rotation axis A×1. Note that although it is not possible to see this in FIGS. 5 and 6, an accommodation hole for accommodating and holding the arm portion 15 such that the arm portion 15 can freely move forward and backward is formed in a main body of a holding mechanism with which the arm portion is provided, and a spring mechanism is provided in the accommodation hole to obtain a configuration with which a normal force applied to the sample in advance is maintained constantly during the test as well. Also, a power sensor is incorporated in the main body of the holding mechanism such that the normal force applied to the sample and frictional force applied in the horizontal direction during the sliding test can be measured in real time. With the aforementioned configuration, the test apparatus used in the present embodiment can perform abrasion evaluation of the mold material that is similar to that in an environment of actual utilization without preparing a mold that simulates an actual worked state. The samples in the examples of the present invention and the comparative examples were attached to the distal end of the aforementioned arm portion 15, and a circular plate-shaped portion (corresponding to a material to be worked) made of SKD61 with hardness of 45HRC was caused to rotate at a rotation speed of 500 mm/s to cause the samples in the examples of the present invention and the comparative examples and the circular plate-shaped portion to slide 7000 times. In regard to lubrication in the sliding experiment, an intermittent lubrication scheme of applying a lubricant to the sample surfaces when an abrasion coefficient μ between the circular plate-shaped portion and the samples reached 0.25 was employed in order to reproduce oil film shortage in the environment of actual utilization. The friction coefficients were obtained in real time in the test on the basis of ratios of the frictional force with respect to the normal force measured by the power sensor. Samples with maximum friction work amounts (derived from the maximum frictional force [N]×the sliding length [mm]) changed in the examples of the present invention and the comparative examples were also created, and sliding portions of the samples were observed every 1000 times of sliding (for the case of less than 1000, the sliding portion was observed every 100 times). Test results of each sample are shown in Table 4.

TABLE 4

| Sample No. | Load (N) | Sliding length (mm) | Maximum frictional force (N) | Maximum friction work amount (J) | Observation result* | Remarks |
|---|---|---|---|---|---|---|
| No. 14 | 3000 | 43 | 750 | 32.3 | No film fracture was observed | Example of the invention |
| No. 15 | 2300 | 78 | 600 | 46.8 | No film fracture was observed | Example of the invention |
| No. 16 | 3200 | 78 | 800 | 62.4 | No film fracture was observed | Example of the invention |
| No. 17 | 3000 | 43 | 750 | 32.3 | Film fracture was observed (6000th time) | Comparative Example |
| No. 18 | 4000 | 43 | 1000 | 43.0 | Film fracture was observed (3000th time) | Comparative Example |
| No. 19 | 2300 | 78 | 600 | 46.8 | Film fracture was observed (2000th time) | Comparative Example |
| No. 20 | 3000 | 78 | 750 | 58.5 | Film fracture was observed (400th time) | Comparative Example |

*Whether films caused fracture before number of times of sliding reached 7000 times On the basis of Table 4, no fracture of the film was observed in Sample Nos. 14 to 16 in the examples of the present invention even when the number of sliding reached 7000 times, and it was confirmed that the samples were in a state in which the test was able to be further continued and had significantly satisfactory sliding properties. On the other hand, fractures of the films occurred in all of Sample Nos. 17 to 20 in the comparative examples before the number of times of sliding reached 6000 times, and it was confirmed that fracture occurred earlier as the maximum friction work amount increased. As described above, it was possible to confirm that the coatings in the examples of the present invention were able to significantly improve the sliding properties as compared with the coatings in the related art and were effective for improving mold lifetime.

The invention claimed is:

1. A coated mold which has a hard coating on a work surface, wherein the hard coating comprises a layer A in which a layer a1 and a layer a2 are alternately laminated, the layer a1 being composed of a Cr-based nitride and having a thickness of 100 nm or less, the layer a2 being composed of a nitride or carbonitride of $(V_{1-a}M_a)$, wherein M is at least one selected from Mo and W, having an atomic ratio a of M to a sum of V and M of 0.05 or more and 0.45 or less, and having a thickness of 80 nm or less.

2. The coated mold according to claim 1, further comprising:
a layer B that is formed on an upper layer of the layer A, the layer B is composed of the nitride or carbonitride of $(V_{1-a}M_a)$, wherein M is at least one selected from Mo and W, has the atomic ratio a of M to the sum of V and M of 0.05 or more and 0.45 or less, and has a thickness of 0.1 μm or more.

3. The coated mold according to claim 1, wherein a Young's modulus in the layer A of the hard coating is 250 Gpa or more, and nanoindentation hardness is 25 Gpa or more.

4. A method for manufacturing a coated mold that has a hard coating on a work surface comprising:
applying a layer A in which a layer a1 and a layer a2 are alternately laminated, the layer a1 being composed of a Cr-based nitride and having a thickness of 100 nm or less, the layer a2 being composed of a nitride or carbonitride of $(V_{1-a}M_a)$, wherein M is at least one selected from Mo and W, having an atomic ratio a of M to a sum of V and M of 0.05 or more and 0.45 or less, and having a thickness of 80 nm or less,
wherein the layer a2 is applied using a hard coat-forming target composed of $(V_{1-a}M_a)$, wherein M is at least one selected from Mo and W and having the atomic ratio a of M to the sum of V and M of 0.05 or more and 0.45 or less.

5. The method for manufacturing a coated mold according to claim 4, further comprising:
applying, on an upper layer of the layer A, a layer B that is composed of the nitride or carbonitride of $(V_{1-a}M_a)$, wherein M is at least one selected from Mo and W, has the atomic ratio a of M to the sum of V and M of 0.05 or more and 0.45 or less, and has a thickness of 0.1 μm or more,
wherein the layer B is applied using a hard coat-forming target composed of $(V_{1-a}M_a)$, wherein M is at least one selected from Mo and W and having the atomic ratio a of M to the sum of V and M of 0.05 or more and 0.45 or less.

* * * * *